(12) United States Patent
Thilenius

(10) Patent No.: US 6,621,445 B1
(45) Date of Patent: Sep. 16, 2003

(54) LOW POWER REFERENCE BUFFER CIRCUIT UTILIZING SWITCHED CAPACITORS

(75) Inventor: Stephen C Thilenius, Pangbourne (GB)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/178,421

(22) Filed: Jun. 24, 2002

(51) Int. Cl.[7] ................................................ H03M 1/12
(52) U.S. Cl. ........................................ 341/172; 327/554
(58) Field of Search ............................... 341/172, 155; 327/100, 111, 554

(56) References Cited

U.S. PATENT DOCUMENTS

RE34,797 E * 11/1994 Sato et al. ............. 365/189.09
5,440,306 A * 8/1995 Tatsumi ....................... 341/150

* cited by examiner

*Primary Examiner*—Peguy JeanPierre
(74) *Attorney, Agent, or Firm*—Pillsbury Winthrop LLP

(57) ABSTRACT

A reference buffer circuit includes a first switched capacitor selectively coupled to a first node that receives a reference voltage from a buffer device connected to the first node. A second switched capacitor is selectively coupled to a voltage source to receive a charging voltage from the voltage source. A first switch is coupled to the first switched capacitor to switch communication of the first switched capacitor between the first node and a second node. And, a second switch is coupled to the second switched capacitor to switch communication of the second switched capacitor between the voltage source and the first node, wherein the second switched capacitor delivers the charging voltage to the first switched capacitor.

18 Claims, 5 Drawing Sheets

Reference buffer circuit 100

Prior art buffer circuit 500

LOW POWER REFERENCE BUFFER CIRCUIT UTILIZING SWITCHED CAPACITORS

BACKGROUND

1. Technical Field

An embodiment of the present invention generally relates to a reference buffer circuit that incorporates switched capacitors. More particularly, an embodiment of the present invention relates to a low power reference buffer circuit in which a second switched capacitor provides a charging voltage to a first switched capacitor.

2. Discussion of the Related Art

A switched capacitor is typically incorporated into a reference buffer circuit by coupling the switched capacitor between the output terminal of a buffer device and a ground potential, as shown in the prior art buffer circuit of FIG. 5. A switch connects the switched capacitor to the buffer device and allows the buffer device to provide a reference voltage to the switched capacitor. The sampling frequency ("$f_s$") of the switched capacitor determines the speed with which the buffer device must charge the switched capacitor. Therefore, the buffer device must charge the switched capacitor every $1/f_s$ seconds. Assuming that the charging period is governed by a 50% duty cycle clock, the buffer device must charge the switched capacitor within ½ $f_s$ seconds. For the ½ $f_s$ second period during which the switched capacitor is not charging, the switched capacitor generally provides its charge to a load circuit. This event occurs when the switch switches from the buffer device to the load circuit.

A buffer device may be a class A amplifier in a unity gain configuration. For example, the output stage would be required to drive:

$$I=C_1(dV/dt)=10pF(1V/1\ ns) \approx 10\ mA => 33\ mW$$

Taking $f_s$ to be 25 MHz, for example, the actual power required is:

$$I=C_1(dV/dt)=10pF(2.4V/40\ ns) \approx 0.6\ mA => 2\ mW$$

Therefore, the efficiency is about 6%. Accordingly, this configuration results in an amplifier having very low efficiency, where efficiency is defined as the average power that is delivered to the load circuit divided by the power that is drawn from the amplifier's power supply. For example, the theoretical maximum efficiency of an amplifier in a class A configuration is 25.0%.

Alternatively, a buffer device may be a class AB amplifier, which has a theoretical maximum efficiency of 78.5%. However, this configuration greatly increases the complexity of the design, as compared to a class A configuration, and may not significantly increase actual efficiency. Furthermore, class AB amplifiers are typically not capable of extremely fast operations.

Regardless of a buffer device's configuration, a reference buffer circuit that includes only one switched capacitor requires that the buffer device independently charge the switched capacitor to a certain voltage level before the switched capacitor may be switched to provide a charge to the load circuit. This technique requires the buffer device to draw a significant amount of power from the buffer device's power supply, thereby reducing the efficiency of the reference buffer circuit.

Thus, there is a need for a reference buffer circuit having a buffer device that draws less power from the buffer device's power supply.

DETAILED DESCRIPTION

Reference in the specification to "one embodiment", "an embodiment", or "another embodiment" of the present invention means that a particular feature, structure or characteristic described in connection with the embodiment is included in at least one embodiment of the present invention. Thus, the appearances of the phrase "in one embodiment" or "according to an embodiment" appearing in various places throughout the specification are not necessarily all referring to the same embodiment. Likewise, appearances of the phrase "in another embodiment" or "according to another embodiment" appearing in various places throughout the specification are not necessarily referring to different embodiments.

Figure 1A:
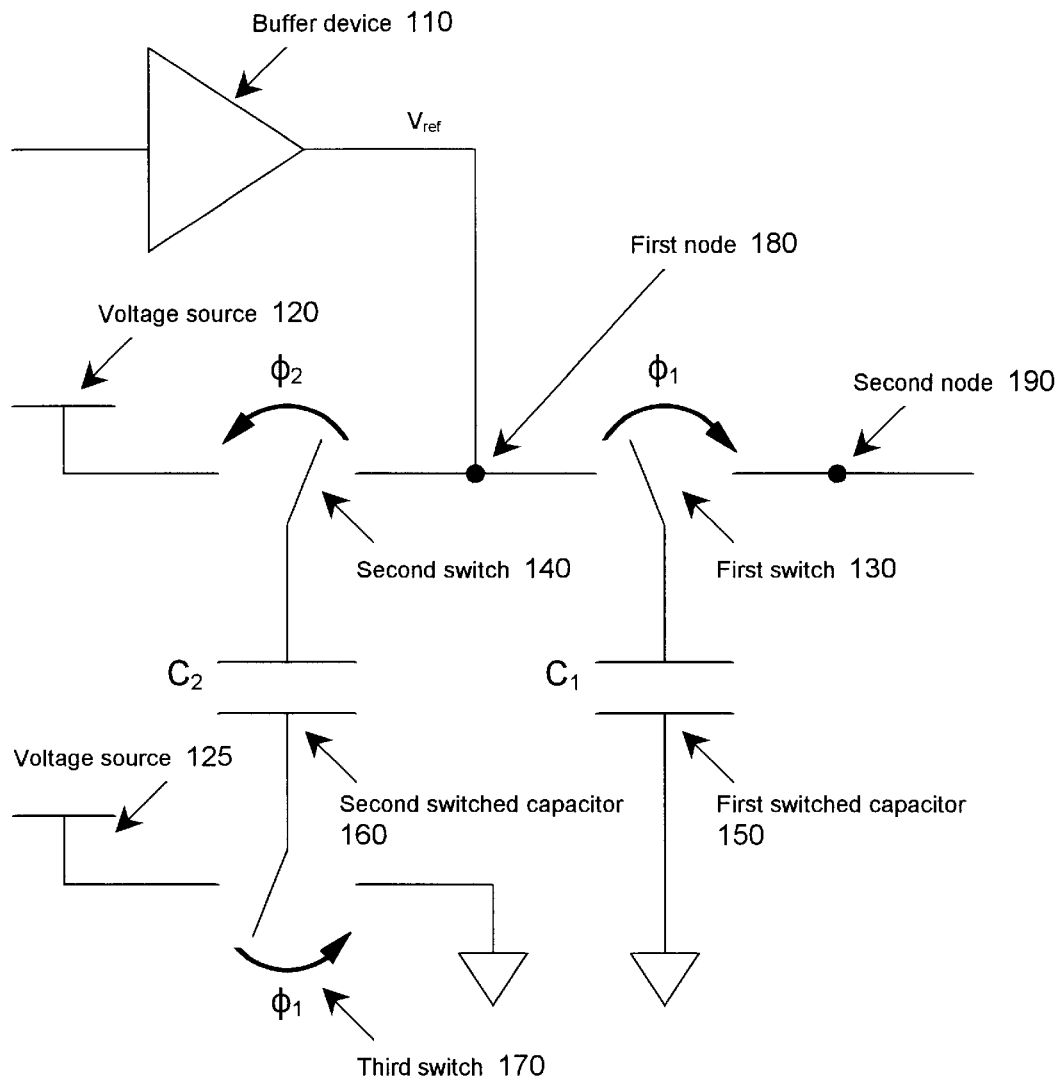
FIG. 1A illustrates a reference buffer circuit according to an embodiment of the present invention.

FIG. 1A illustrates a reference buffer circuit according to an embodiment of the present invention. The reference buffer circuit 100 includes a buffer device 110, a voltage source 120, a first switch 130, a second switch 140, a first switched capacitor 150, a second switched capacitor 160, a first node 180, and a second node 190. The buffer device 110 is coupled to the first node 180 to provide a reference voltage to the first switched capacitor 150. The voltage source 120 provides a charging voltage to the second switched capacitor 160. The first switch 130 is coupled to the first switched capacitor 150 to switch between the first node 180 and the second node 190. The second switch 140 is coupled to the second switched capacitor 160 to switch between the voltage source 120 and the first node 180. The first switched capacitor 150 receives the reference voltage from the buffer device 110. The second switched capacitor 160 delivers the charging voltage to the first switched capacitor 150.

According to an embodiment of the present invention, the reference buffer circuit 100 may further include a third switch 170 coupled to the second switched capacitor 160 to switch between the second voltage source 125 and a reference potential. The reference potential may be a ground potential.

In an embodiment of the present invention, referring to FIG. 1A, the second switched capacitor $C_2$ 160, being a smaller capacitor, is charged to $2*V_{cc}$ in the period of time that the first switched capacitor $C_1$ 150 is connected to the circuit side. When the charge phase starts, the second switched capacitor $C_2$ 160 is momentarily shortened to that of the first switched capacitor $C_1$ 150, which is about 6 ns out of 18 ns in this instance. The capacitance for the second switched capacitor $C_2$ 160 is as follows:

$$C_2=C_1(V_{ref}/2*V_{cc}+V_{ref})$$

In this configuration, when the charging cycle is switched to, the combined charge and voltage is:

$$Q = C_2 * 2 * V_{cc}$$

$$V_{final} = Q_{final}/C_{total} = C_2 * 2 * V_{cc}/C_1 + C_2 = V_{ref}$$

Figure 1B:
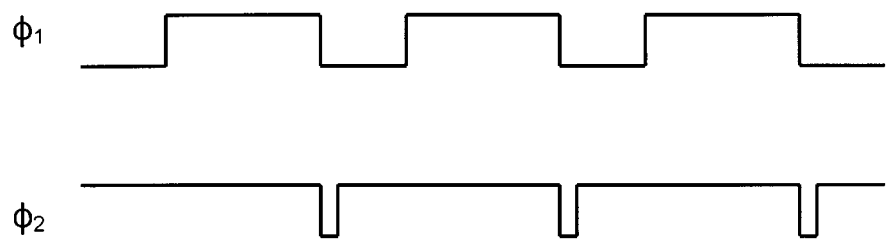
FIG. 1B illustrates corresponding $\phi_1$ and $\phi_2$ signals utilized to actuate switches illustrated in FIG. 1A.

Referring to FIG. 1A, the switches 130, 140 are in the direction of the arrow when the φ signal is high (see FIG. 1B, illustrating the corresponding $\phi_1$ and $\phi_2$ signals that actuates the switches). When the two capacitors are shorted together, ignoring all possible sources of error, the charge distributes evenly between them, yielding a voltage of $V_{ref}$ on each capacitor. However, sources of error do exist, such as power supply variation. With these errors, the capacitor switching technique gets one to within +/−10% or so of the $V_{ref}$.

Figure 5:
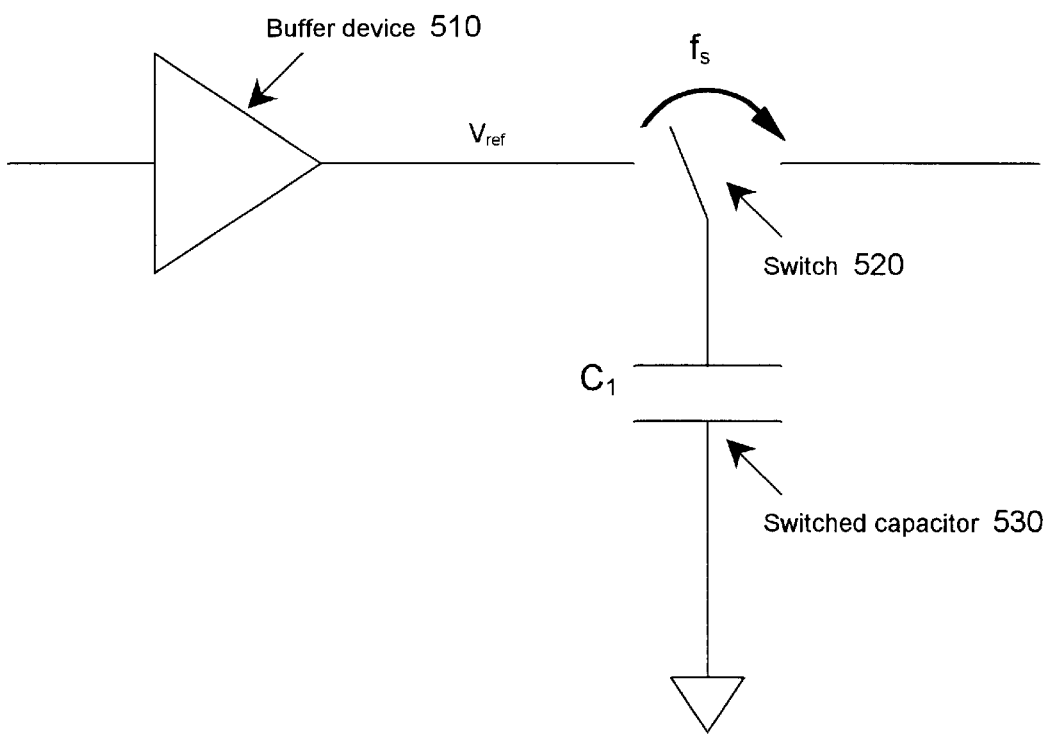
FIG. 5 illustrates a prior art buffer circuit.

But the design requirements for the $V_{ref}$ buffer 110 are greatly decreased compared to the prior art design, such as in FIG. 5. Because the buffer device 110 now only needs to change the voltage by $1/10^{th}$ of the $V_{ref}$, it may be designed to consume $1/10^{th}$ of the power. The total design, as illustrated in FIG. 1A, is 40% efficient, as compared to the 6% efficiency as discussed about with respect to FIG. 5. In other words, the power is reduced from 33 mW (as discussed above) to 5 mW. It is not necessary to charge second switched capacitor $C_2$ 160 to $2V_{cc}$ vs. $V_{cc}$, but doing so decreases the necessary capacitance by a factor of two. For the short period of time that the capacitors are connected together, the $V_{ref}$ buffer 110 is already attempting to get the capacitor voltage to exactly $V_{ref}$, so, the less capacitance presented, the more effective and lower power the buffer becomes.

Figure 2:
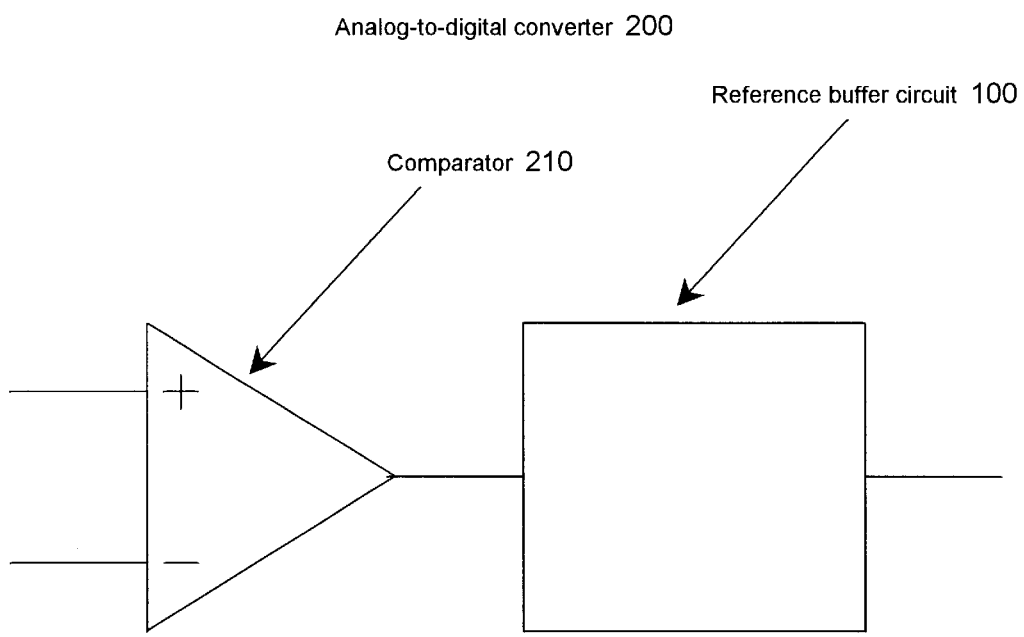
FIG. 2 illustrates an analog-to-digital ("A/D") converter according to an embodiment of the present invention.

FIG. 2 illustrates an analog-to-digital ("A/D") converter according to an embodiment of the present invention. The A/D converter 200 includes a comparator 210 and a reference buffer circuit 100. The comparator 210 may compare an analog input voltage and a first reference voltage. The reference buffer circuit 100 may receive an output of the comparator 210.

Figure 3:
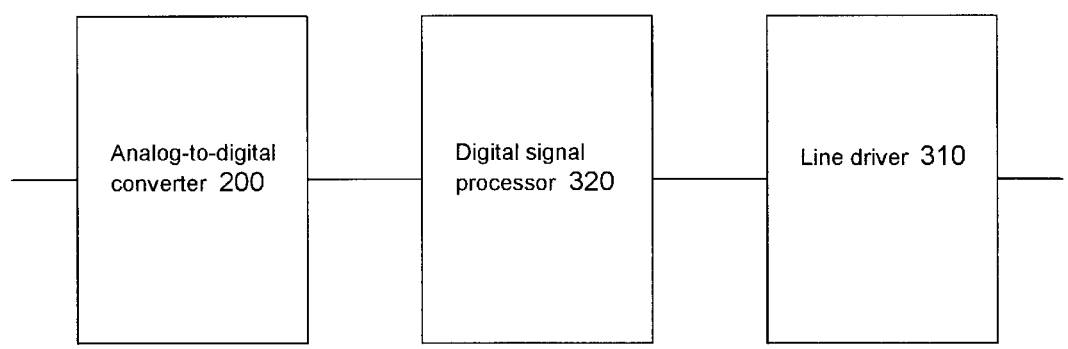
FIG. 3 illustrates a block diagram of a digital subscriber line transceiver according to an embodiment of the present invention.

FIG. 3 illustrates a digital subscriber line ("DSL") transceiver according to an embodiment of the present invention. The DSL transceiver includes a line driver 310, a digital signal processor ("DSP") 320, and an A/D converter 200. The line driver 310 is used to extend the transmission distance of a digital signal. The DSP 320 is used to manipulate the digital signal. The A/D converter 200 provides the digital signal.

Figure 4:
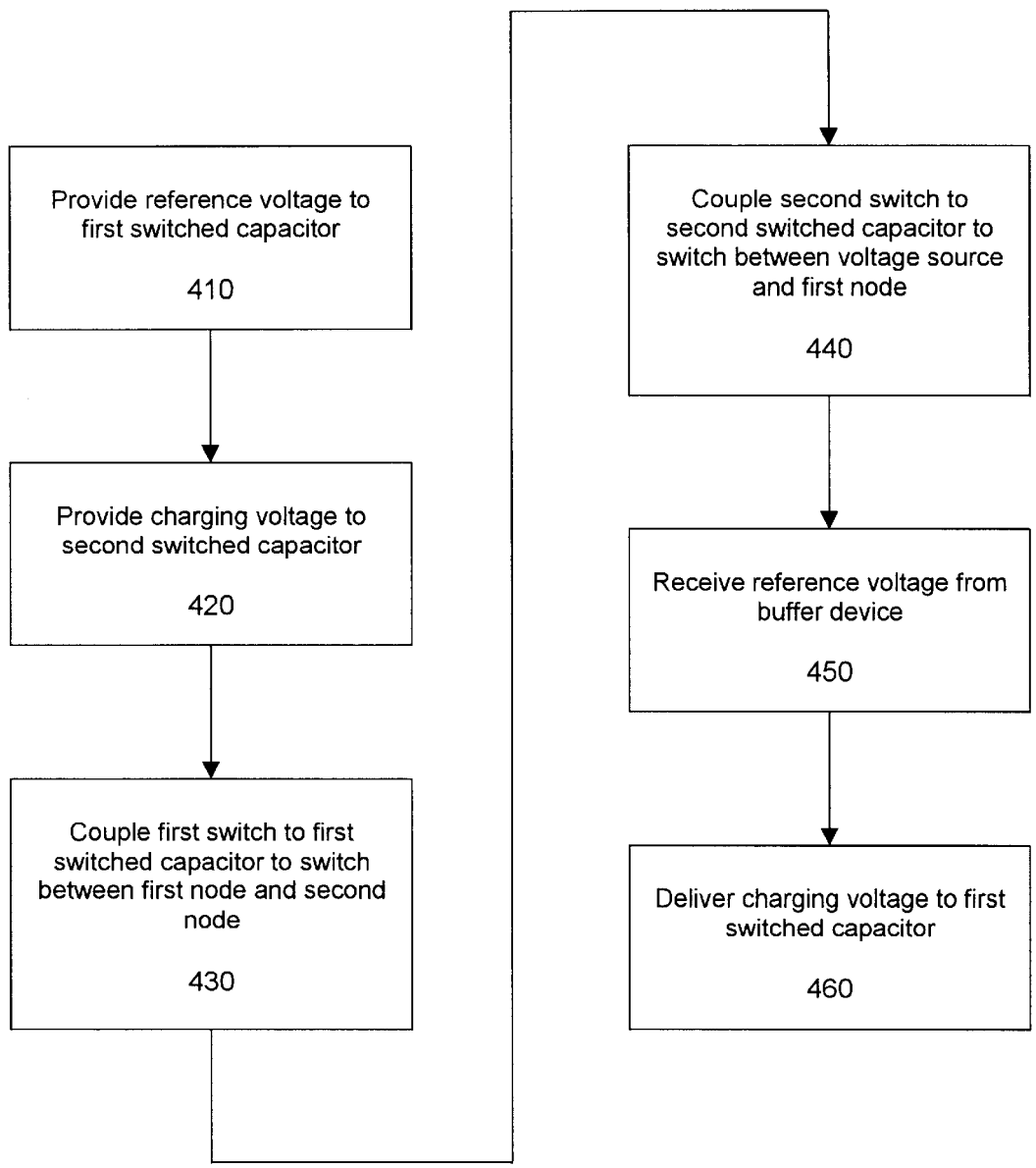
FIG. 4 illustrates a flow chart for a method of improving the efficiency of a reference buffer circuit according to an embodiment of the present invention.

FIG. 4 illustrates a flow chart for a method of improving the efficiency of a reference buffer circuit according to an embodiment of the present invention. Within the method and referring to FIG. 1, a buffer device 110 may provide 410 a reference voltage to a first switched capacitor 150. A voltage source 120 may provide 420 a charging voltage to a second switched capacitor 160. A first switch 130 is coupled 430 to the first switched capacitor 150 to switch between a first node 180 and a second node 190. A second switch 140 is coupled 440 to the second switched capacitor 160 to switch between a voltage source 120 and the first node 180. A third switch 170 may be coupled to the second switched capacitor 160 to switch between the voltage source 120 and a reference potential. The reference potential may be a ground potential. The first switched capacitor 150 may receive 450 the reference voltage from the buffer device 110. The second switched capacitor 160 may deliver 460 the charging voltage to the first switched capacitor 150.

In short, the reference buffer circuit 100 according to an embodiment of the present invention reduces the power consumed by the buffer device 110, thereby increasing the efficiency of the buffer device 110. Consequently, the efficiency of the reference buffer circuit 100 is increased. Specifically, the second switched capacitor 160 provides a charging voltage to the first switched capacitor 150, so that the buffer device 110 subsequently need only supply a portion of the power that is typically required to charge the first switched capacitor 150. The second switched capacitor 160 provides a significant portion of the reference voltage to the first switched capacitor 150. Thus, the buffer device 110 need only change the voltage across the first switched capacitor 150 by a fraction of the reference voltage. Furthermore, the reference buffer circuit 100 according to an embodiment of the present invention may operate at a higher frequency than a typical reference buffer circuit, because implementation of the second switched capacitor 160 allows the first switched capacitor 150 to recharge more quickly.

While the description above refers to particular embodiments of the present invention, it will be understood that many modifications may be made without departing from the spirit thereof. The accompanying claims are intended to cover such modifications as would fall within the true scope and spirit of an embodiment of the present invention. The presently disclosed embodiments are therefore to be considered in all respects as illustrative and not restrictive, the scope of an embodiment of the invention being indicated by the appended claims, rather than the foregoing description, and all changes that come within the meaning and range of equivalency of the claims are therefore intended to be embraced therein.

What is claimed is:

1. A reference buffer circuit, comprising:
    a first switched capacitor selectively coupled to a first node that receives a reference voltage from a buffer device connected to the first node;
    a second switched capacitor selectively coupled to a voltage source to receive a charging voltage from the voltage source;
    a first switch coupled to the first switched capacitor to switch communication of the first switched capacitor between the first node and a second node; and
    a second switch coupled to the second switched capacitor to switch communication of the second switched capacitor between the voltage source and the first node, wherein the second switched capacitor delivers the charging voltage to the first switched capacitor.

2. The reference buffer circuit according to claim 1, further including a third switch coupled to the second switched capacitor to switch between the voltage source and a reference potential.

3. The reference buffer circuit according to claim 2, wherein the reference potential is a ground potential.

4. An analog-to-digital ("A/D") converter, comprising:
    a comparator to compare an analog input voltage and a first reference voltage; and
    a reference buffer circuit to receive an output of the comparator, including
        a first switched capacitor selectively coupled to a first node that receives a second reference voltage from a buffer device connected to the first node,
        a second switched capacitor selectively coupled to a voltage source to receive a charging voltage from the voltage source,
        a first switch coupled to the first switched capacitor to switch communication of the first switched capacitor between the first node and a second node, and
        a second switch coupled to the second switched capacitor to switch communication of the second switched capacitor between the voltage source and the first node, wherein the second switched capacitor delivers the charging voltage to the first switched capacitor.

5. The analog-to-digital converter according to claim 4, wherein the reference buffer circuit further includes a third switch coupled to the second switched capacitor to switch between the voltage source and a reference potential.

6. The analog-to-digital converter according to claim 5, wherein the reference potential is a ground potential.

7. The analog-to-digital converter according to claim 4, wherein the first reference voltage and the second reference voltage are same.

8. A digital subscriber line ("DSL") transceiver, comprising:
   a line driver to extend a transmission distance of a digital signal;
   a digital signal processor ("DSP") to manipulate the digital signal; and
   an analog-to-digital ("A/D") converter to provide the digital signal, having
      a comparator to compare an analog input voltage and a first reference voltage, and
      a reference buffer circuit, including
         a first switched capacitor selectively coupled to a first node that receives a second reference voltage from a buffer device connected to the first node,
         a second switched capacitor selectively coupled to a voltage source to receive a charging voltage from the voltage source,
         a first switch coupled to the first switched capacitor to switch communication of the first switched capacitor between the first node and a second node, and
         a second switch coupled to the second switched capacitor to switch communication of the second switched capacitor between the voltage source and the first node, wherein the second switched capacitor delivers the charging voltage to the first switched capacitor.

9. The DSL transceiver according to claim 8, wherein the reference buffer circuit further includes a third switch coupled to the second switched capacitor to switch between the voltage source and a reference potential.

10. The DSL transceiver according to claim 9, wherein the reference potential is a ground potential.

11. The DSL transceiver according to claim 8, wherein the first reference voltage and the second reference voltage are same.

12. A method of improving efficiency of a reference buffer circuit, comprising: providing a reference voltage to a first switched capacitor;
   providing a charging voltage to a second switched capacitor;
   coupling a first switch to the first switched capacitor to switch between a first node and a second node;
   coupling a second switch to the second switched capacitor to switch between a voltage source and the first node;
   receiving the reference voltage from a buffer device; and
   delivering the charging voltage to the first switched capacitor.

13. The method according to claim 12, further including coupling a third switch to the second switched capacitor to switch between the voltage source and a reference potential.

14. The method according to claim 13, wherein the reference potential is a ground potential.

15. The method according to claim 12, wherein the providing of the reference voltage to the first switched capacitor is performed by the buffer device.

16. The method according to claim 12, wherein the providing of the charging voltage to the second switched capacitor is performed by the voltage source.

17. The method according to claim 12, wherein the receiving of the reference voltage from the buffer device is performed by the first switched capacitor.

18. The method according to claim 12, wherein the delivering of the charging voltage to the first switched capacitor is performed by the second switched capacitor.

* * * * *